United States Patent
Hokenmaier

(10) Patent No.: US 7,158,434 B2
(45) Date of Patent: Jan. 2, 2007

(54) SELF-REFRESH CIRCUIT WITH OPTIMIZED POWER CONSUMPTION

(75) Inventor: Wolfgang Hokenmaier, Burlington, VT (US)

(73) Assignee: Infineon Technologies, AG, Munich (DE)

( * ) Notice: Subject to any disclaimer, the term of this patent is extended or adjusted under 35 U.S.C. 154(b) by 55 days.

(21) Appl. No.: 11/117,855

(22) Filed: Apr. 29, 2005

(65) Prior Publication Data

US 2006/0245288 A1 Nov. 2, 2006

(51) Int. Cl.
*G11C 7/00* (2006.01)

(52) U.S. Cl. .............. 365/222; 365/227; 365/229

(58) Field of Classification Search ........... 365/222, 365/230.02, 230.06, 189.08, 189.09, 227, 365/229

See application file for complete search history.

(56) References Cited

U.S. PATENT DOCUMENTS

| | | | |
|---|---|---|---|
| 4,914,630 A | 4/1990 | Fujishima et al. | |
| 4,933,907 A | 6/1990 | Kumanoya et al. | |
| 5,331,601 A | 7/1994 | Parris | |
| 5,796,669 A | 8/1998 | Araki et al. | |
| 5,875,143 A | 2/1999 | Ben-Zvi | |
| 6,079,023 A | 6/2000 | Yoon et al. | |
| 6,134,167 A * | 10/2000 | Atkinson | 365/222 |
| 6,163,225 A * | 12/2000 | Sundaram et al. | 331/57 |
| 6,226,709 B1 | 5/2001 | Goodwin et al. | |
| 6,233,192 B1 | 5/2001 | Tanaka | |
| 6,363,024 B1 | 3/2002 | Fibranz | |
| 6,373,769 B1 | 4/2002 | Kiehl et al. | |
| 6,404,690 B1 | 6/2002 | Johnson et al. | |
| 6,418,067 B1 | 7/2002 | Watanabe et al. | |
| 6,580,651 B1 | 6/2003 | Han | |
| 6,597,622 B1 | 7/2003 | Lee et al. | |
| 6,603,694 B1 | 8/2003 | Frankowsky et al. | |
| 6,603,704 B1 | 8/2003 | Wilson | |
| 6,680,875 B1 | 1/2004 | Horiguchi et al. | |
| 6,704,234 B1 | 3/2004 | Mizugaki | |
| 6,765,839 B1 * | 7/2004 | Park | 365/222 |
| 6,779,136 B1 | 8/2004 | Richter et al. | |
| 6,862,238 B1 | 3/2005 | Lee | |
| 6,930,944 B1 * | 8/2005 | Hush | 365/222 |
| 7,027,343 B1 * | 4/2006 | Sinha et al. | 365/222 |
| 2002/0191466 A1 * | 12/2002 | Hwang et al. | 365/222 |
| 2003/0198099 A1 * | 10/2003 | Park | 365/200 |
| 2004/0032772 A1 * | 2/2004 | Takahashi | 365/202 |
| 2006/0018174 A1 * | 1/2006 | Park et al. | 365/222 |
| 2006/0146616 A1 * | 7/2006 | Heo et al. | 365/189.09 |

* cited by examiner

*Primary Examiner*—Son T. Dinh
*Assistant Examiner*—Hien N Nguyen
(74) *Attorney, Agent, or Firm*—Dicke, Billig & Czaja, PLLC

(57) ABSTRACT

A random access memory device has a memory array, and a refresh rate generator circuit. The memory array has a plurality of memory cells that are configured to hold a charge. The memory array has an active mode and a standby mode. The refresh rate generator circuit is coupled to the memory array and is configured to generate a refresh signal having a rate. The refresh signal is used to periodically refresh the memory cells. The memory device detects when the memory array changes from its standby mode to its active mode and then increases the rate of the refresh signal when the memory array changes from its standby mode to its active mode.

28 Claims, 3 Drawing Sheets

SELF-REFRESH CIRCUIT WITH OPTIMIZED POWER CONSUMPTION

BACKGROUND

The present invention relates to a circuit for use with a refresh signal. In one embodiment, this circuit enables adjustment of the rate of the refresh signal in a memory device.

In dynamic random access memories (DRAMs), in order to retain data stored in memory cells, the cells are refreshed at cyclical intervals. In typical DRAM memory cells, information or data is stored as capacitor charges. These capacitive charges are subject to leakage currents. Consequently, the stored charges on the capacitors within the DRAM have to be repeatedly renewed in order to retain the charges and the data.

Typical DRAM consists of a multitude of memory cells accessible by word lines and bit lines. The memory cells are typically further divided into memory banks. The refreshing of memory contents of the memory cells in the DRAM is generally carried out word line-by-word line, or row-by-row, with an internal refresh circuit. For low power or mobile DRAM applications where small current consumption is emphasized to extend battery life, various techniques are utilized in an attempt to minimize these refresh operations, because they consume significant current.

In many present day DRAM applications, the total amount of power consumed by the application, including by the DRAM, is becoming a major consideration. This is particularly important in the market driven by mobile applications. A significant portion of the power that is consumed by the application's DRAM is during refresh operations. The DRAM's refresh operations are required to maintain the stored information in the memory cell that will otherwise be lost without refreshing. Thus, it is important that as little power as possible be consumed during the DRAM's retention mode.

A significant factor in determining the amount of power consumed by the refresh operation is the frequency of, or how often, the refresh operation must take place. Typically, the refresh rate of a DRAM must be increased during active mode relative to the rate in standby operation. Increased noise during active mode typically requires an increased refresh rate.

In most cases, refresh rate times are optimized for the active mode of the DRAM product. In this way, the refresh rate during standby is unnecessarily high. For some commodity DRAM products this does not present difficulty due to somewhat relaxed power specification in this mode. For devices where power consumption is critical, however, this presents challenges. For example, most hand-held or mobile applications require data retention during long periods of nonuse.

For this and other reasons, a need exists for the present invention.

SUMMARY

One aspect of the present invention provides a random access memory device with a memory array, and a refresh rate generator circuit. The memory array has a plurality of memory cells that are configured to hold a charge. The memory array has an active mode and a standby mode. The refresh rate generator circuit is coupled to the memory array and is configured to generate a refresh signal having a rate. The refresh signal is used to periodically refresh the memory cells. The memory device detects when the memory array changes from its standby mode to its active mode and then increases the rate of the refresh signal when the memory array changes from its standby mode to its active mode.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
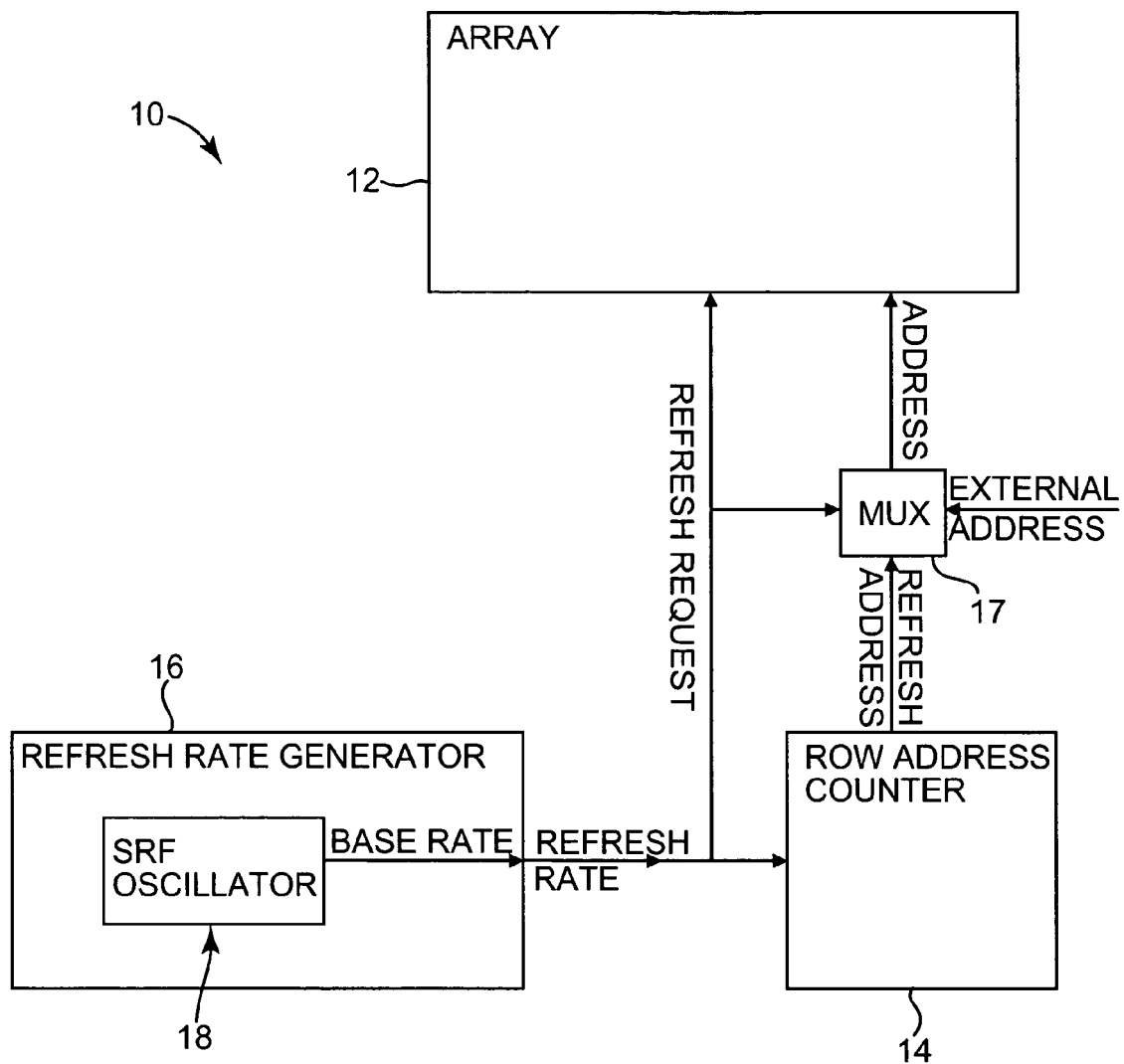
FIG. 1 illustrates a portion of a memory component including a refresh rate generator.

FIG. 1 illustrates a portion of a memory component 10. Memory system 10 includes memory array 12, row address counter 14, refresh rate generator 16 and multiplexer 17. In one embodiment, memory system 10 is a portion of a dynamic random access memory (DRAM) semiconductor chip. In operation, memory system 10 can receive and store data.

Memory array 12 includes a plurality of word lines and bit lines, the intersection of which defines a plurality of memory cells in which data is stored. In operation, read and write operations to and from the memory cells are effected by external address commands received by multiplexer 17. Access to the individual memory cells is then controlled by the external address signal received by multiplexer 17, which then issues the appropriate address controls to the word lines and bit lines of memory array 12 to store and retrieve data. Memory system 10 generally has two modes: an active mode and a standby mode. In an active mode, external address commands are received by multiplexer 17 such that memory cells are accessed, and in standby mode no external address commands are received by multiplexer 17 such that memory cells are not accessed.

Whether in active mode or standby mode, the various memory cells within memory array 12 must be periodically refreshed in order to retain data within memory array 12. Typically, refreshing memory array 12 occurs by refreshing word line-by-word line, or row-by-row. In this way, when a refresh signal pulse is provided to a selected word line, all the memory cells coupled to that word line are refreshed. In one embodiment, several thousand memory cells are coupled to each word line, and each of the thousands of memory cells are refreshed when a refresh signal pulse is provided to the associated word line.

Refresh generator 16 generates the refresh signal used to refresh memory array 12. Refresh rate generator 16 includes a self-refresh oscillator 18. Self-refresh oscillator 18 generates a base rate signal that is used by a refresh rate generator 16 to produce the refresh rate used by memory array 12 to refresh the memory cells. The base rate generated by self-refresh oscillator 18 may be divided as required in order to provide the appropriate refresh rate to memory array 12. The appropriate refresh rate can vary depending on the conditions of memory array 12.

The refresh signal generated by refresh rate generator 16 is also provided to row address counter 14. Row address counter 14 tracks word lines or rows within memory array 12, such that it monitors which row or word line is being refreshed. For example, row address counter 14 will start at 0000 when the first word line of memory array 12 is refreshed, and then increment until it reaches 1111 when the last word line of memory array 12 is refreshed. Row address counter 14 will then roll over and begin counting again at 0000 when the first word line of memory array 12 is again refreshed. Is will also out put an overflow signal when it rolls over from the last row to the first row.

In many DRAM devices, multiple word lines are refreshed at a time. For example, in one case each refresh signal pulse or refresh event refreshes eight word lines at once (thereby refreshing all the memory cells coupled to those eight word lines). Depending on the overall size of the memory array 12, such refresh events would need to occur thousands of times in order to refresh the entire memory array. Row address counter 14 tracks the row in memory array 12, row-by-row, or multiple rows-by-multiple rows, until the entire memory array 12 has been refreshed.

When each of the word lines in memory array 12 have been cycled through, thereby presenting a single refresh signal pulse to each of the word lines, a "refresh cycle" is complete. This refresh cycle is then repeated periodically in order to ensure that data is retained in the memory cells. In some DRAM devices, a refresh signal pulse must be presented every 16 microseconds in order to retain data in the memory cells.

Figure 2:
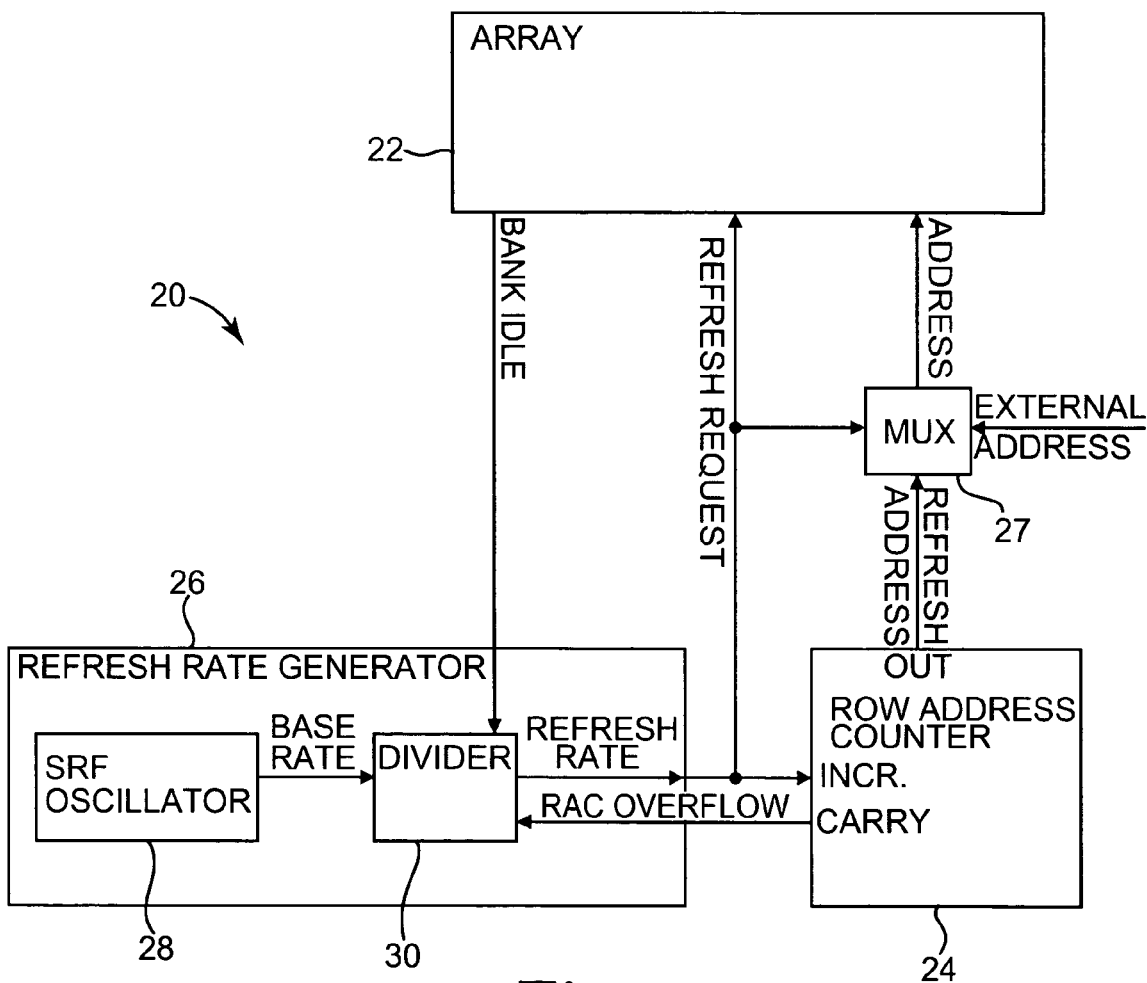
FIG. 2 illustrates a portion of a memory component including a refresh rate generator with divider circuit in accordance with one embodiment of the present invention.

FIG. 2 illustrates a portion of a memory system 20 in accordance with one embodiment of the present invention. Memory system 20 includes memory array 22, row address counter 24, refresh rate generator 26 and multiplexer 27. Refresh rate generator 26 further includes self-refresh oscillator 28, and divider 30. In operation of one embodiment of memory system 20, refresh rate generator 26 is configured to produce a refresh signal with a rate that is optimized for a standby mode of memory system 20. Then, memory system 20 enables refresh rate generator 26 to detect when an active mode is entered, thereby enabling refresh rate generator 26 to increase rate of the refresh signal for that active mode. In this way, by using a lower refresh rate during standby operation, power consumption is decreased with memory system 20.

In one embodiment, memory array 22 includes a plurality of memory banks, each of which are addressable by word lines and bit lines when an external address command is received by multiplexer 27. Each time any of the plurality of memory banks is accessed, there is noise generated within memory array 22 that can have a negative effect adjacent memory cells. In order to account for this potential effect, the refresh rate of memory system 20 is increased during its active mode, that is, when any of the plurality of memory banks is accessed. A relatively lower rate is then used when memory system 20 is in its standby mode.

In one embodiment, a bank idle signal transitions from "high" to "low" when memory system 20 enters its active mode. The bank idle signal transitions from "low" to "high" when memory system 20 exits its active mode and enters its standby mode. In this way, any time an external address command is received by multiplexer 27 such that there is bank activity within memory array 22, the bank idle signal goes low. Thus, in one embodiment, the bank idle signal is used to trigger a rate adjustment to the refresh signal.

As illustrated in FIG. 2, the bank idle signal from memory array 22 is directed to refresh rate generator 26. In this way, refresh rate generator 26 can adjust the rate of the refresh signal in accordance with the state of the bank idle signal. In one embodiment, divider 30 within refresh rate generator 26 is configured to receive the bank idle signal. Divider 30 also receives a base rate signal from self-refresh oscillator 28. Divider 30 then uses this base rate signal to derive the refresh signal, which in one embodiment, is optimized for a standby mode of memory system 20. Then, when the bank idle signal indicates activity in memory array 22, divider 30 increases the base rate received from self-refresh oscillator 28. Thus, the refresh signal produced by divider 30 increases in frequency when memory array 22 enters an active mode. In one embodiment, when the bank idle signal goes low, divider 30 doubles the frequency of the refresh signal.

In one embodiment, the refresh signal generated in refresh rate generator 26 is provided to row address counter 24 and to memory array 22. As with row address counter 14 of memory system 10 above, row address counter 24 tracks the rows of the memory banks of memory array 22. As indicated above in reference to row address counter 14, row address counter 24 tracks the rows in memory array 22 during a refresh cycle, such that row address counter 24 monitors when the entire memory array 22 has been refreshed. Again, each row with the various banks of memory array 22 receives a refresh signal pulse row-by-row (or by multiple rows at a time), until all the rows are refreshed during a refresh cycle.

When the rows or word lines in memory array 22 have all been cycled through, thereby presenting a single refresh signal pulse to each of the word lines, the refresh cycle is complete. When the last row is refreshed, row address counter 24 generates an overflow signal at a carry port indicating that the last row of memory array 22 was reached. The overflow signal thus indicates the end of a complete refresh cycle. In one embodiment, the overflow signal at the carry port of row address counter 24 is sent to divider 30 of refresh rate generator 26. In this way, the rate of the refresh signal can be decreased under certain circumstances in response to the overflow signal.

In one embodiment, the overflow signal is used to ensure that at least one full refresh cycle occurs at an increased refresh rate after the memory array 22 returns to the standby mode after having been in the active mode. For example, when the active mode is detected via the bank idle signal, refresh rate generator 26 produces the increased frequency refresh signal for as long as memory system 20 remains in the active mode. That increased frequency refresh signal then continues for at least one refresh cycle of memory array 22 after memory system returns to standby mode. Memory array 22 is refreshed row-by-row (or by multiple rows at a time) until all of the rows have been refreshed for the entire memory array 22. Once the end of all the rows is reached, the row address counter 24 produces the overflow signal at the carry port.

If the change of modes from active to standby occurs in the middle of a refresh cycle, however, it will not be sufficient to use the increased frequency refresh signal for just the remainder of the refresh cycle, because then an entire refresh cycle will not have been achieved when the refresh rate generator 26 receives the overflow signal. Thus, in one embodiment, refresh rate generator 26 will continue to provide the refresh signal with an increased frequency until a second overflow signal is received. This ensures that at least one full refresh cycle is completed after the mode changes back to the standby mode after it had been in the active mode. Then, as long as the bank signal indicates that memory array 22 remains in the standby mode, the decreased frequency refresh signal is continually generated by refresh rate generator 26, thereby decreasing power consumption in memory system 20.

In most cases, it is quite complicated to determine exactly which row, or even which bank, within memory array 22 is currently being refreshed thereby causing the production of the low bank idle signal indicating the active mode. Thus, one embodiment of memory system 20 refreshes an entire memory cycle beyond the cycle in which the bank idle signal is received, regardless of what row is being refreshed when the mode change occurs. Thus, in some cases the increased refresh rate would be used to refresh nearly two full cycles through memory array 22 (when the mode change occurs when the first rows of memory array 22 are being refreshed) and in other cases the increased refresh rate would be used for exactly one memory cycle through memory array 22 (when the mode change occurs when the last rows of memory array 22 are being refreshed). In a typically case, something between these two extreme cases would occur.

Figure 3:
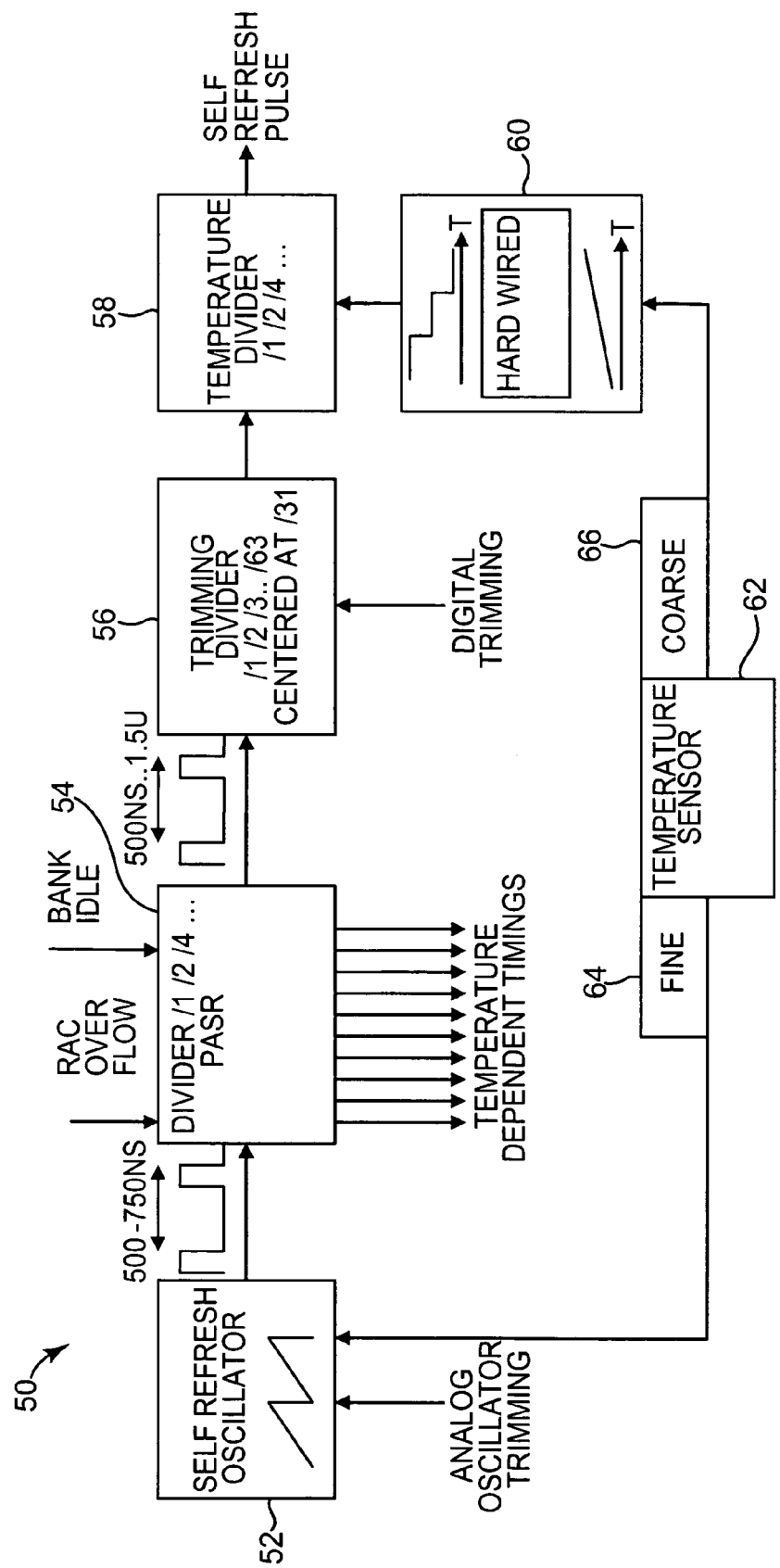
FIG. 3 illustrates a refresh rate control circuit in accordance with one embodiment of the present invention.

FIG. 3 illustrates one embodiment of a refresh rate generator circuit 50 in accordance with one embodiment of the present invention. Refresh rate generator circuit 50 includes self-refresh oscillator 52, divider PASR 54, trimming divider 56, and temperature divider 58. Self-refresh oscillator 52 produces a base rate signal that may be further divided by dividers 54–58 to produces a self-refresh pulse used in refreshing memory arrays, such as the above-described memory arrays 12 and 22.

In one embodiment, temperature divider 58 adjusts the self-refresh signal based on the temperature of the memory system in which refresh rate generator circuit 50 is used. Typically, the refresh rate needed to retain data in memory cells will also vary depending on proximity temperature. In this way temperature sensor 62, with fine adjuster 64 and coarse adjuster 66, measure the temperature proximate to the various memory cells, and use these measurements, via hard wired connection 60, to provide control signals to temperature divider 58. In this way, temperature divider 58 is controlled to adjust the self-refresh signal based on the temperature of the memory system. Further adjustments to the self-refresh signal can also be made via trimmer divider 56 with known techniques of digital trimming. Finally, divider PASR 54 adjusts the self-refresh signal based on the active and standby modes of a memory system, as will be further described below.

In one embodiment, self-refresh oscillator 52 produces a base signal with pulses on the order of 500 to 750 nanoseconds. Generally, a signal producing a pulse every 500 to 750 nanoseconds is significantly faster than would be needed as self-refresh pulse for refreshing memory arrays in most DRAM devices. Consequently, this signal is divided down in order to produce a rate more appropriate for use as a self-refresh signal.

Divider PASR 54 receives the base signal from self-refresh oscillator 52, and under certain conditions, divides the base signal to provide a targeted frequency of the self-refresh signal. In one embodiment, divider PASR 54 further receives a RAC overflow signal from a row address counter and receives a bank idle signal from a memory array. Similar to that described above with respect to memory system 20 illustrated in FIG. 2, divider PASR 54 then adjusts the frequency of the self-refresh signal depending on these received signals.

For example, when the active mode is detected via the bank idle signal, divider PASR 54 further divides the base signal to produce an increased frequency self-refresh signal for at least one refresh cycle of the associated memory array. Once the end of the refresh cycle is reached as indicated by the RAC overflow signal (or by two by the RAC overflow signals in some embodiments), divider PASR 54 then decreases the frequency of self-refresh signal to a level appropriate for the standby mode.

In one alternative embodiment, rather than using an increased rate of the self-refresh signal for two refresh cycles determined by two RAC overflow signal, divider PASR 54 is configured to increase the rate for a set length of time. For example, upon receiving the active signal, such as bank idle signal, the divider PASR 54 increases the frequency of the self-refresh signal for a small fixed amount of time, for example, 128 microseconds. In some circumstances, the set amount of time is established to cover the amount of time that most active modes will last. In such a configuration, the RAC overflow would not be needed.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A random access memory device comprising:
 a memory array having a plurality of memory cells configured to hold a charge, the memory array having an active mode and a standby mode;
 a refresh rate generator circuit coupled to the memory array and configured to generate a refresh signal having a rate, the refresh signal used to periodically refresh the memory cells; and
 means for detecting when the memory array changes from its standby mode to its active mode and for increasing the rate of the refresh signal when the memory array changes from its standby mode to its active mode.

2. The random access memory device of claim 1 wherein the memory array further comprises a plurality of memory banks, wherein accessing any of the plurality of memory banks changes the memory array from its standby mode to its active mode.

3. The random access memory device of claim 1 further comprising means for detecting when the memory array changes from its active mode to its standby mode and for increasing the rate of the refresh signal for at least one refresh cycle after the memory array changes from its active mode to its standby mode.

4. The random access memory device of claim 3, wherein all of the memory cells of the memory array are refreshed in one refresh cycle.

5. The random access memory device of claim 3 further comprising means for decreasing the rate of the refresh signal after the memory array changes from its active mode to its standby mode.

6. The random access memory device of claim 1, wherein the memory cells of the memory array are addressable by a plurality of word lines and bit lines, wherein the refresh signal refreshes all the memory cells coupled to each word line, and wherein the memory array generates a bank idle signal indicative of when the memory array is in an active mode and when the memory array is in a standby mode.

7. A semiconductor memory device comprising:
a memory array having a plurality of memory cells, the memory array configured to generate a bank idle signal;
a refresh rate generator circuit coupled to the memory array and configured to generate a refresh signal at a rate used to refresh the memory cells during a refresh cycle;
an address counter coupled to the memory array and configured to monitor row address information and to generate an overflow signal indicative of an end of the refresh cycle; and
a divider circuit coupled to the refresh rate generator circuit and configured to receive the bank idle signal and the overflow signal and to adjust the rate of refresh signal based on the bank idle signal and the overflow signal.

8. The semiconductor memory device of claim 7, wherein the bank idle signal is indicative of memory bank activity including an active memory mode and a standby memory mode.

9. The semiconductor memory device of claim 8, wherein the refresh rate generator and divider circuits generate the refresh signal at a first rate that is optimized to refresh the memory cells during the standby memory mode.

10. The semiconductor memory device of claim 9, wherein the refresh rate generator and divider circuits generate the refresh signal at a second rate, which is increased in frequency relative to the first rate, in response to the bank idle signal indicating that the memory array is in the active memory mode.

11. The semiconductor memory device of claim 10, wherein the refresh rate generator and divider circuits continue to generate the refresh signal at the second rate until the overflow signal indicates that a full refresh cycle was completed after the memory array returned to the standby mode.

12. The semiconductor memory device of claim 10, wherein the refresh rate generator and divider circuits continue to generate the refresh signal at the second rate until a set time period has passed after the memory array returned to the standby mode.

13. A refresh rate generator circuit for use in refreshing a memory array in a random access memory device, the refresh rate generator circuit comprising:
a signal generator that produces an oscillating signal having a base rate; and
a first frequency divider configured to receive the oscillating signal from the signal generator, to receive an idle signal from the memory array and to receive an address counter signal, the first frequency divider responsively producing a refresh signal;
wherein the first frequency divider produces the refresh signal at a first rate when the idle signal from the memory array is in a first state and wherein the first frequency divider produces the refresh signal at a second rate when the idle signal from the memory array is in a second state.

14. The refresh rate generator circuit of claim 13, wherein the memory array has a plurality of memory cells that are periodically refreshed by the refresh signal, and wherein the idle signal from the memory array indicates when the memory array is in an active mode and when it is in a standby mode.

15. The refresh rate generator circuit of claim 14, wherein the first frequency divider is further configured to receive an overflow signal from an address counter, the overflow signal indicative of an end of a refresh cycle of the memory array.

16. The refresh rate generator circuit of claim 15, wherein the first state of the memory array is a standby mode, wherein the second state of the memory array is an active, and wherein the first rate has a lower frequency than the second rate.

17. A method of decreasing power consumption in a dynamic memory device, the method including the steps of:
providing a semiconductor memory device with at least one memory array having a plurality of memory cells configured to hold a charge;
periodically refreshing the memory cells with a refresh signal in order to retain the charge;
generating an idle signal indicative of an active mode of the memory array; and
adjusting the rate of the refresh signal based on the idle signal.

18. The method of claim 17 further including increasing the rate of the refresh signal when the memory array changes from a standby mode to the active mode, wherein accessing the memory array defines the active mode and wherein no access to the memory array defines the standby mode.

19. The method of claim 18 further including decreasing the rate of the refresh signal when the memory array changes from the active mode to the standby mode.

20. The method of claim 19 further including refreshing all of the memory cells of the memory array in one refresh cycle.

21. The method of claim 20 further including detecting when the memory array changes from the active mode to the standby mode, refreshing all of the memory cells of the memory array in one refresh cycle, and then decreasing the rate of the refresh signal.

22. A method of adjusting a refresh signal in a semiconductor memory device comprising:
providing a memory array having a plurality of memory cells;
producing a bank idle signal from the memory array;
generating a refresh signal at a rate used to refresh the memory cells during a refresh cycle;
generating an overflow signal indicating an end of the refresh cycle of the memory array; and
adjusting the rate of refresh signal based on the bank idle signal and the overflow signal.

23. The method of claim 22 further including increasing the rate of the refresh signal when the memory array is accessed and decreasing the rate of the refresh signal when the memory array is not accessed.

24. A method for adjusting a refresh rate comprising:
producing an idle signal from a memory array indicated when the memory array is accessed;
producing an oscillating signal having a base rate;
dividing the oscillating signal from the signal generator based on the idle signal to produce the refresh rate.

25. The method of claim 24 further including providing the refresh rate to the memory array to refresh memory cells within the memory array.

26. The method of claim 25 further including increasing the rate of the refresh signal when the memory array is accessed and decreasing the rate of the refresh signal when the memory array is not accessed.

27. A dynamic random access memory device comprising:
   a plurality of memory arrays each having a plurality of memory cells configured to hold a charge, the memory arrays collectively having an active mode and a standby mode;
   a refresh rate generator circuit coupled to the memory array and configured to generate a refresh signal having a rate, the refresh signal used to periodically refresh the memory cells; and
   a divider circuit coupled within the refresh rate generator circuit, the divider circuit configured to receive an indication of when the memory array changes from its standby mode to its active mode further configured to increase the rate of the refresh signal when the memory array changes from its standby mode to its active mode.

28. The dynamic random access memory device of claim 27, wherein the plurality of memory arrays and the refresh rate generator circuit, including the divider circuit, are assembled into a chip package.

* * * * *